United States Patent
Englhardt

(10) Patent No.: US 7,074,000 B2
(45) Date of Patent: Jul. 11, 2006

(54) METHOD AND APPARATUS FOR UNDOCKING SUBSTRATE POD WITH DOOR STATUS CHECK

(75) Inventor: Eric A. Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/335,225

(22) Filed: Dec. 31, 2002

(65) Prior Publication Data

US 2004/0126207 A1 Jul. 1, 2004

(51) Int. Cl.
*H01L 21/677* (2006.01)

(52) U.S. Cl. ............ 414/217.1; 414/805; 414/940
(58) Field of Classification Search ......... 414/217, 414/217.1, 805, 940
See application file for complete search history.

(56) References Cited

U.S. PATENT DOCUMENTS

| | | | |
|---|---|---|---|
| 4,754,344 A * | 6/1988 | Shoji et al. ................ 360/48 |
| 6,082,951 A | 7/2000 | Nering et al. |
| 6,427,096 B1 * | 7/2002 | Lewis et al. .............. 700/228 |
| 2002/0015636 A1 * | 2/2002 | Lee et al. ................. 414/407 |
| 2002/0044859 A1 * | 4/2002 | Lee et al. ................. 414/411 |
| 2002/0069933 A1 * | 6/2002 | Otaguro ..................... 141/98 |
| 2003/0103835 A1 * | 6/2003 | Nagata ..................... 414/217 |

* cited by examiner

*Primary Examiner*—Thomas J. Brahan
(74) *Attorney, Agent, or Firm*—Dugan & Dugan

(57) ABSTRACT

A pod loading station includes a docking mechanism adapted to move a pod between a docked position and an undocked position, and a door opener adapted to unlatch and open a pod door from the pod. A controller is coupled to the docking mechanism and the door opener and is programmed to cause the pod to move from the docked position to the undocked position, and then to cause the pod to move back to the docked position so that it can be determined whether the pod door is properly closed prior to completing the removal of the pod from the pod loading station.

15 Claims, 3 Drawing Sheets

METHOD AND APPARATUS FOR UNDOCKING SUBSTRATE POD WITH DOOR STATUS CHECK

FIELD OF THE INVENTION

The present invention is concerned with semiconductor manufacturing, and is more particularly concerned with transportation of semiconductor substrates in a closed container.

BACKGROUND OF THE INVENTION

Semiconductor manufacturing typically entails performing a number of processes, including thin film deposition, photolithography, oxidation, nitration and so forth. A convention apparatus for performing such processes is known as a "processing tool" and may include several processing chambers coupled to a central transfer chamber. One or more load lock chambers may also be coupled to the transfer chamber. The load lock chamber or chambers are used to load substrates into and remove substrates from the processing tool.

Due to the complexity of many semiconductor manufacturing processes, the number of individual process steps to be performed frequently exceeds the number of process chambers included in a processing tool. Accordingly, it is generally necessary to transport substrates from one processing tool to another. It is customary, during such transportation of substrates, to carry the substrates in a closed container known as a "pod." Conventional pods include a door which seals the pod so that the substrates are isolated from the ambient atmosphere while in the pod. In this way, the possibility of contamination of the substrates can be reduced.

It is conventional to provide a pod loading station in front of a processing tool for the purpose of receiving a pod containing substrates, opening the pod door, and allowing substrates to be removed from the pod and transferred to the processing tool. When processing of the substrates is complete, the substrates are placed back in the pod, the pod door is closed and locked, and the pod is taken away from the pod loading station for delivery to another processing tool, or to a storage location, etc.

It may sometimes occur that the replacement and locking of the pod door, after processing and replacement of the wafers in the pod, may be performed improperly. If this occurs, the pod door may become displaced or may fall off the pod, which can result in contamination or serious damage to the substrates contained in the pod.

SUMMARY OF THE INVENTION

An inventive pod loading station comprises a docking mechanism adapted to move a pod between a docked position and an undocked position, and a door opener adapted to unlatch and open a door of the docked pod. A controller is coupled to the docking mechanism and the door opener and is programmed to cause the pod to move from the docked position to the undocked position, and then to cause the pod to move back to the docked position so that it can be determined whether the pod door is properly closed prior to completing the removal of the pod from the pod loading station. A method of operating the inventive pod loading station is also provided, as is a computer program product for causing a pod loading station to operate in accordance with the invention.

DETAILED DESCRIPTION

In accordance with the invention, when it is time to undock a pod containing processed wafers from a pod loading station, the pod is first undocked, then redocked to the pod loading station to check the status of the pod door. If the condition of the pod door is found to be satisfactory, the pod is again undocked and may then be removed from the pod loading station.

As used herein and in the following claims, "docking" should be understood to include moving a pod to a position at which the door of the pod may be opened by a pod loading station. "Undocking" should be understood to include moving a pod away from a position in which the pod door may be opened. A "pod" includes any container adapted to hold at least one substrate and having a door.

Figure 1:
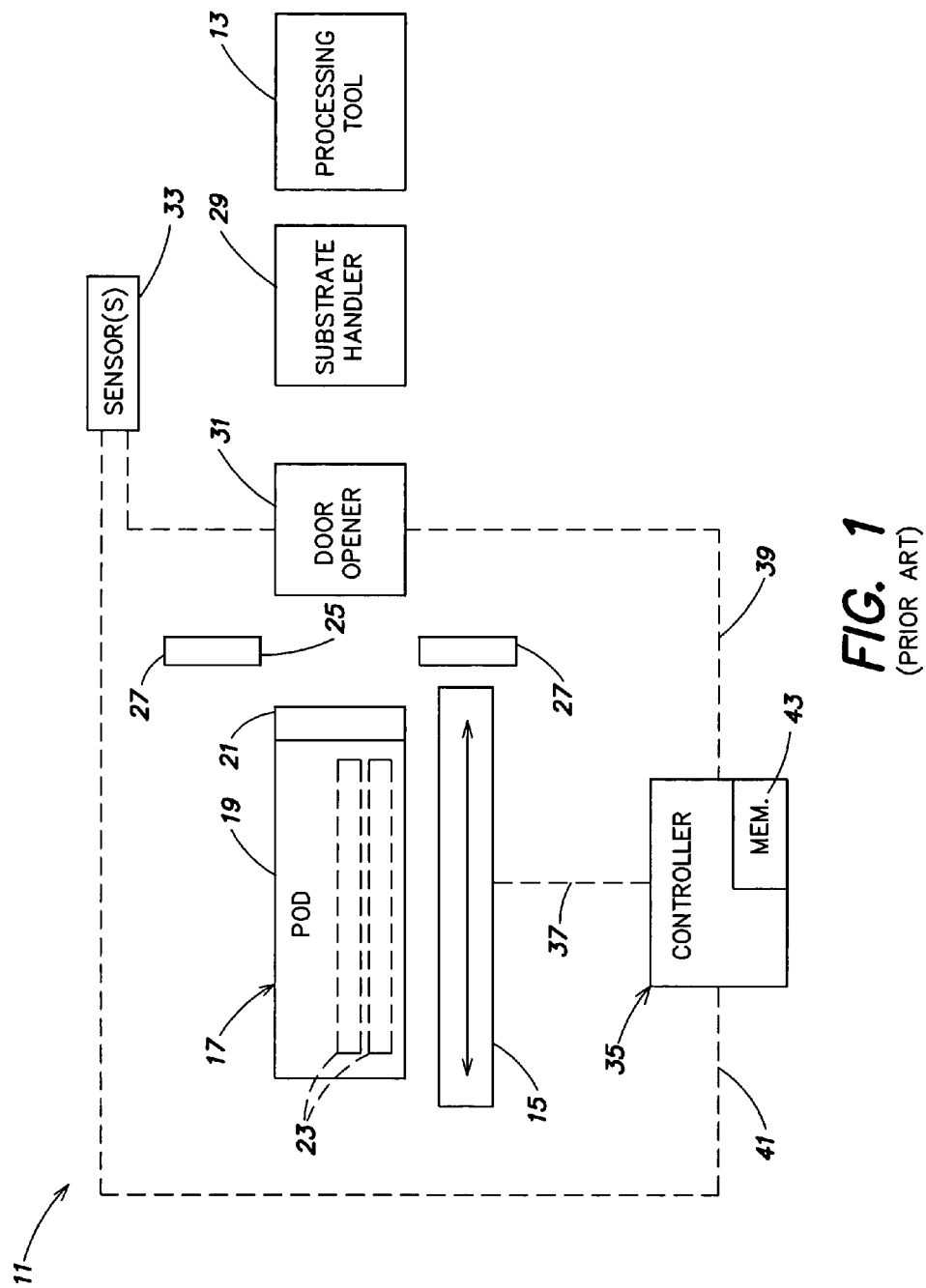
FIG. 1 is a schematic side view of a conventional arrangement of a pod loading station associated with a processing tool.

FIG. 1 is a schematic side view of a conventional pod loading station 11, associated with a processing tool 13. As will be seen from subsequent discussion, the present invention may be performed at the conventional pod loading station 11, as well as in other types of loading stations.

The conventional pod loading station 11 shown in FIG. 1 includes a docking mechanism 15 which is adapted to support a pod 17. The docking mechanism 15 is also adapted to move the pod 17 between a docked position and an undocked position. Typically the movement of the pod 17 between the docked and undocked positions involves horizontal movement of the pod 17.

Although the illustration of the docking mechanism 15 in FIG. 1 suggests that the pod 17 rests on top of the docking mechanism 15, alternatively, the docking mechanism 15 may be arranged to support the pod 17 via a flange or other feature on the top and/or sides of the pod.

The pod 17 may be any one of a number of conventional or proposed pods. One example of a suitable pod is a standard front opening unified pod (FOUP) which is well-known to those who are skilled in the art. The pod 17 includes a pod body 19 to which a pod door 21 is removably secured. The pod body 19 may include internal structures (not separately shown) which define storage locations for one or more substrates 23 (shown in phantom). In the particular example illustrated in FIG. 1, the substrates 23 are contained within the pod body 19 in a horizontal orientation. However, other orientations are possible.

In addition to the docking mechanism 15, the pod loading station 11 also includes an opening 25 formed in a cleanroom wall 27. Typically the docking mechanism 15 is located such that a pod positioned thereon is adjacent to the opening 25. It is also conventional to provide a substrate handler 29 between the opening 25 and the processing tool 13. The processing tool 13, the substrate handler 29, the opening 25, and the docking mechanism 15 are arranged relative to each other such that when the pod 17 is in the docked position, and the pod door 21 has been removed, the substrate handler 29 is able to extend through the opening 25 to remove a substrate 23 from the pod body 19 and to transfer the substrate 23 to the processing tool 13.

The pod loading station 11 also typically includes a door opener 31 which is adapted to unlatch and open (e.g., unlock and remove) the pod door 21 when the pod 17 is in a docking position. According to one known arrangement, after the pod door 21 is unlocked by the door opener 31, the door opener 31 moves the pod door 21 horizontally away from the pod body 19, and then moves the pod door 21 upwardly or downwardly to clear the opening 25.

U.S. Pat. No. 6,082,951, discloses another apparatus which may be used as the door opener 31. The '951 patent is commonly assigned herewith, and is incorporated herein by reference. For the door opener disclosed in the '951 patent, after unlocking of the pod door 21 by the door opener 31, the pod body 19 is moved a short distance away from the door opener 31 by the docking mechanism 15, and the door opener 31 then is able to move the pod door 21 downwardly to clear the opening 25, without first moving the pod door 21 horizontally. Other door opener arrangements are also known.

The conventional pod loading station 11 illustrated in FIG. 1 also includes one or more sensors 33 that are associated with (e.g., included in) the door opener 31. The sensor or sensors 33 are adapted to sense one or more of (a) a condition of the pod door 21, (b) a condition of the pod 17, and (c) a condition of the door opener 31 or of another component of the pod loading station 11. For example, the sensor or sensors 33 may be adapted to determine whether the pod door 21 is properly positioned for removal when the pod 17 is in the docking position. Detection of the following conditions may indicate that the pod door is not properly positioned for opening:

a. if the pod door 21 is not fully seated on the pod body 19, then the vacuum cups (described further below) may not properly seal to the pod door 21;

b. if the pod door 21 is not fully seated on the pod, the docking mechanism 15 may not reach the docked position; and c. if the pod door 21 is seated but the pod door latches are not fully engaged in the pod body 19, the door latches will not be fully rotated, and may interfere with latch keys on the load port door thus preventing the pod from reaching the docked position, preventing the vacuum cups (described further below) from sensing the pod door 21, or preventing operation of other door sensing sensors.

Various types of sensors are or may be used as the sensor or sensors 33. For example, some sensors use a vacuum arrangement (e.g., a cup adapted to seal to a front surface of the pod door 21) to detect proper positioning of the pod door 21. In such an arrangement, for example, if the pod door 21 is out of position, the sensor cup may fail to seal so that no vacuum is formed within the sensor cup. In such a case, a pressure sensor may indicate the failure to achieve vacuum, thereby signalling that the pod door 21 is out of position.

Other types of sensors may include a mechanism which may contact a surface of the pod door 21 and may detect a position that indicates whether or not the pod door 21 is properly positioned, or may detect a pressure (applied to the sensor by the pod door 21) that indicates whether or not the pod door 21 is properly positioned. The sensing of a greater or a lesser pressure than a predetermined desired pressure, indicates that the pod door 21 is not properly positioned. Note that an improper position may be signaled when the pod door 21 is improperly latched (which may cause substrates to be dropped or otherwise contaminated) or when the pod itself is improperly positioned on the docking mechanism 15 (which may cause the entire pod to be dropped or mishandled).

In a more specific example, the sensor(s) 33 may comprise one or more spring loaded keys (not shown) which enter into corresponding key holes on the pod door 21, when the pod door 21 is properly positioned (e.g., properly latched to a properly positioned pod) and in the docked position. The sensor keys may be driven backward by the front surface of the pod door 21 (e.g., rather than entering the corresponding key holes) if the pod door 21 is not properly positioned for removal. The driving backward of one or more of the spring loaded keys may be detected by a pressure and/or position sensor coupled to the key, and may thereby signal that the pod door 21 is out of position. Alternatively, other contact sensors such as mechanical microswitches, or optical interrupt switches with spring loaded buttons may be employed (whether adapted to contact the surface of the pod door or to enter the key hole of the pod door). Non-contact sensors such as capacitance switches or optical interrupt sensors, etc., may be similarly employed.

The conventional pod loading station 11 illustrated in FIG. 1 also includes a controller 35 that is coupled via signal paths 37, 39, 41, to the docking mechanism 15, the door opener 31 and the sensor or sensors 33, respectively. The controller 35 may include one or more memory devices (represented by reference numeral 43) which may be suitable for storing a program to control the controller 35, as described below.

Although not illustrated in FIG. 1, the controller 35 may also be coupled via signal paths to one or both of the substrate handler 29 and the processing tool 13, so as to control operations thereof. Alternatively, one or more other controllers (not shown) may be present to control the substrate handler 29 and the processing tool 13, and may be in communication with the pod loading station controller 35.

Figure 2:
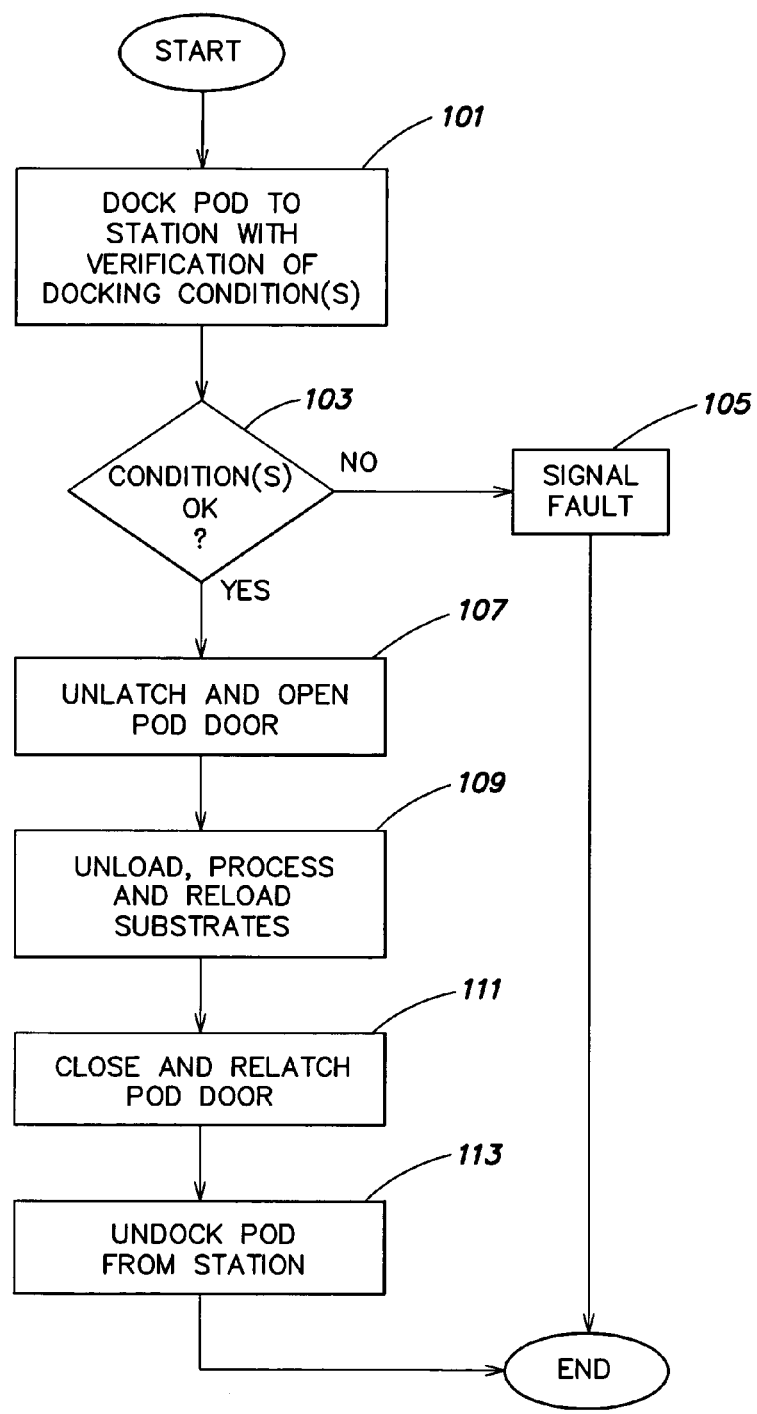
FIG. 2 is a flow chart which illustrates a conventional process performed at a pod loading station.

FIG. 2 is a flow chart that illustrates a conventional process performed at a pod loading station such as the pod loading station 11 of FIG. 1.

Prior to beginning the process of FIG. 2, it is assumed that the pod 17, has a locked door 21, contains substrates 23 to be processed by the processing tool 13, and has been placed in an undocked position on the docking mechanism 15. Placement of the pod 17 on the docking mechanism 15 may be performed manually, or by an automated device.

The process of FIG. 2 begins with step 101, at which the pod 17 is moved from the undocked position to a docked position (e.g., via the docking mechanism 15), and the sensor or sensors 33 are used to verify that the pod 17, the pod door 21 and/or the pod loading station 11 are in a proper condition for removal of the pod door 21. For example, proper positioning of the pod door 21 may be detected.

A decision block 103 follows block 101. At decision block 103 it is determined whether the sensor or sensors indicate proper positioning of the pod door 21 for removal and/or other conditions required for pod door removal. If not, then a fault is signaled (step 105). However, if a proper condition is found at decision block 103, then step 107 follows. For example, the sensor or sensors 33 may send a signal to the controller 35 to indicate proper positioning of the pod door 21, and the controller 35 may then control the door opener 31 to unlatch and open (e.g., pivot or remove) the pod door.

Following step 107 is step 109. At step 109, the substrate handler 29 unloads the substrates 23 from the pod 17, the substrates 23 are processed in the processing tool 13, and are then loaded back into the pod 17.

Following step 109, at step 111, the controller 35 controls the door opener 31 to close (e.g., shut or replace) the pod door 21 on the pod body 19, and to lock the pod door 21. In this manner, the pod door 21 is secured to the pod body 19.

Next, at step 113, the controller 35 controls the docking mechanism 15 to move the pod 17 (with processed substrates 23 contained therein, and having the locked door 21 secured thereto) from the docked position to an undocked position. The pod 17 may then be transported away from the pod loading station 11 to, e.g., another processing tool (not shown) or to a storage location (not shown). Often, however, the pod door 21 may not be properly closed and/or latched prior to pod transport, and substrates may become contaminated or otherwise damaged.

Figure 3:
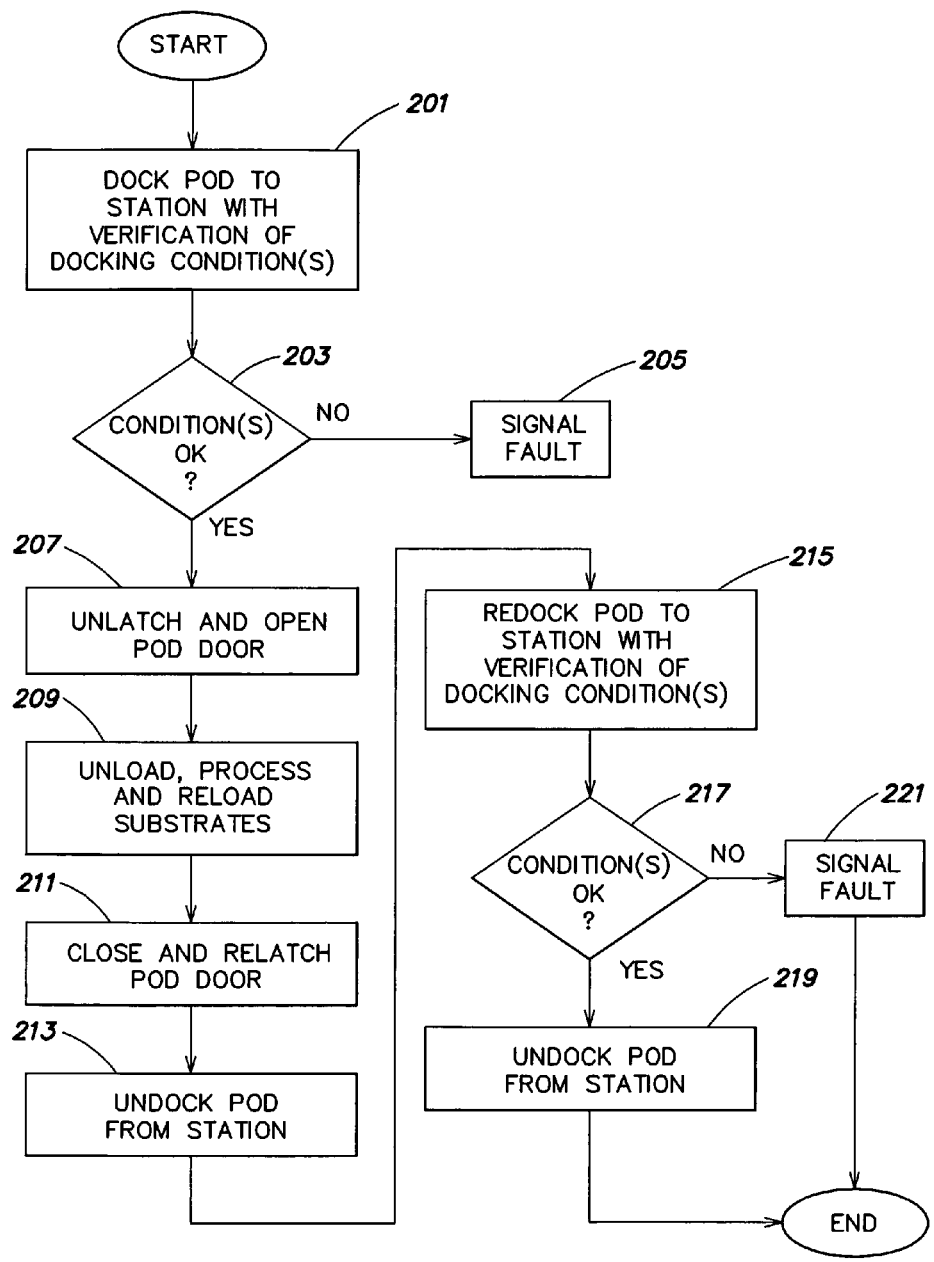
FIG. 3 is a flow chart that illustrates an improved process performed at a pod loading station in accordance with the present invention.

FIG. 3 is a flow chart that illustrates an improved process performed in accordance with the present invention at a pod loading station such as the pod loading station 11 of FIG. 11. The inventive method of FIG. 3 may be performed by the conventional hardware arrangement shown in FIG. 1, without modification, except that the controller 35 may be modified by changing the software which controls the controller 35 or by otherwise modifying the controller 35 to change the manner in which other components of the pod loading station 11 are controlled. As so modified, or with the controller 35 programmed in accordance with the invention, the pod loading station 11 of FIG. 1 should be considered to be an apparatus provided in accordance with the present invention. As previously discussed, the inventive process may be performed in any pod loader, and the pod loader shown and described with reference to FIG. 1 is merely exemplary of one such pod loading station.

The inventive process of FIG. 3 may include steps 201–213, which may be performed entirely or substantially in the same manner as the steps 101–113 of the conventional process of FIG. 2. Thus, in the process of FIG. 3, after the pod 17, containing substrates 23 and with a locked pod door 21, is placed on the docking mechanism 15 in an undocked position, the process of FIG. 3 (like the process of FIG. 2) begins with the docking mechanism 15 moving the pod 17 to a dock position, and with a sensor or sensors 33 verifying that proper conditions exist for removal of the pod door 21 (step 201). For example, proper positioning of the pod door 21 may be detected. If conditions are appropriate (as determined at step 203) the pod door 21 is unlatched and opened by the door opener 31 (step 207). Otherwise, a fault is signaled (step 205). The unlatching and opening of the pod door 21 may be performed under control of the controller 35 in response to a first signal received from the sensor or sensors 33 that indicates proper positioning of the pod door 21.

Following unlatching and opening of the pod door 21, the substrates are unloaded from the pods 17, processed in the processing tool 13, and reloaded into the pod 17 (step 209). The pod door 21 then is closed and latched (step 211). Following closing and latching of the pod door 21, the controller controls the docking mechanism 15 to move the pod 17 from the docked position to the undocked position (step 213).

At this point, instead of removal of the pod 17 from the pod loading station 11, at step 215, the pod is redocked (i.e., moved back into a docked position) and the sensor or sensors 33 are again employed to verify proper condition(s) for door removal (such as proper positioning of the pod door 21 on the pod body 19). Thus step 215 may be performed in substantially the same manner as step 201 of FIG. 3 and as step 101 of FIG. 2. Following step 215 is a decision block 217 (which may be similar to block 203 of FIG. 3 and block 103 of FIG. 2), at which it is determined whether appropriate conditions for door removal were detected at step 215. If appropriate conditions for door removal were detected at step 215, then step 219 follows decision block 217. That is, instead of opening the pod door 21 in response to detection of proper pod door positioning, the controller 35 controls the docking mechanism 15 so as to again move the pod 17 from the docked position to the undocked position. The pod 17 is then available for transportation to another processing tool, a storage location, etc. Step 219 may be performed in response to the controller 35 receiving a second signal from the sensor or sensors 33 that indicates the pod door 21 is in a proper position.

Referring again to decision block 217, if it is determined that an improper condition (e.g. improper positioning of the pod door 21) exists, then a fault may be signaled (step 221) in similar fashion to step 205 (FIG. 3) and step 105 (FIG. 2).

Thus, in accordance with the invention, after initially undocking the pod 17 (which follows reloading of substrates 23 into the pod and locking of the pod door 21), with the pod 17 redocked to the pod loading station 11, and one or more sensors 33 are used to sense whether conditions relating to the pod 17 and/or the pod door 21 are proper. For example, the sensor or sensors 33 may be used to sense that the pod door 21 is properly positioned on the pod body 19. If proper conditions are sensed, then the pod 17 is again undocked from the pod loading station 11 and made available for transportation away from the pod loading station 11. If proper conditions are not sensed, then a fault is signaled so that remedial steps may be taken (such as manual intervention) . In this manner, failure to properly close and/or latch the pod door 21 may be detected prior to removing the pod 17 from the pod loading station 11. Consequently, it may be possible to reduce the risks of the pod door 21 coming loose from the pod 17 in transit. As a result, the risks of contamination or other damage to substrates 23 contained in the pod 17 may be reduced. This in turn may result in higher manufacturing yields and reduced per unit manufacturing cost.

Another advantage of the inventive process of FIG. 3 is that the additional steps included therein that are not included in the conventional process of FIG. 2 may be the same as or substantially the same as steps conventionally employed in operation of a pod loading station (such as those shown and described in reference to FIG. 2). Consequently, the program that controls the controller 35 to perform the inventive process may be created via a simple modification of a pod loader's conventional control program. Such a program embodying the inventive process of FIG. 3 may be provided as a computer program product that may be carried by a medium readable by a computer (e.g., a carrier wave signal, a floppy disk, a hard drive, a random access memory, the memory device or devices 43 of FIG. 1, etc).

The foregoing description discloses only exemplary embodiments of the invention; modifications of the above disclosed apparatus and method which fall within the invention will be readily apparent to those with ordinary skill in the art. For example, it was noted in conjunction with step 213 of FIG. 3 that this step may be performed in the same manner as step 113 of FIG. 2. However, the undocking performed in step 213 of FIG. 3 may alternatively involve moving the pod 17 a shorter distance away from the door opener 31 than when the pod is moved in connection with the undocking of step 113 of FIG. 2. Similarly, the pod may be undocked a greater distance in connection with step 219 than in step 213.

The present invention may be employed in connection with pods that contain two or more substrates as well as with pods that contain only a single substrate.

Accordingly, while the present invention has been disclosed in connection with the preferred embodiments thereof, it should be understood that other embodiments will fall with the spirit and scope of the invention, as defined by the following claims.

The invention claimed is:

1. A method comprising:
   undocking a pod from a pod loading station;
   redocking the pod to the pod loading station;
   sensing a condition of a door of the redocked pod; and
   again undocking the pod from the pod loading station after the sensing step,
   wherein the door of the redocked pod is not unlatched prior to again undocking the pod from the pod loading station after the sensing step.

2. The method of claim 1 wherein again undocking the pod from the pod loading station after the sensing step occurs without opening the door of the redocked pod.

3. The method of claim 1, wherein the pod contains at least one substrate during undocking a pod from a pod loading station and redocking the pod to the pod loading station.

4. The method of claim 3, wherein the pod contains a plurality of substrates during undocking a pod from a pod loading station and redocking the pod to the pod loading station.

5. The method of claim 1 wherein sensing includes detecting a position of the door of the redocked pod.

6. The method of claim 1, wherein the door is in a latched condition during undocking a pod from a pod loading station; redocking the pod to the pod loading station; and sensing a condition of a door of the redocked pod.

7. The method of claim 1 wherein sensing a condition of a door of the redocked pod comprises sensing a position of the door of the redocked pod.

8. The method of claim 7 further comprising signaling a fault if the sensor senses that the door is not properly positioned.

9. A method comprising:
   docking a pod which has a latched pod door and contains at least one substrate to a pod loading station;
   sensing a condition of at least one of the pod, the pod door and the pod loading station;
   unlatching and opening the pod door;
   unloading the at least one substrate from the pod;
   processing the unloaded at least one substrate;
   loading the processed at least one substrate into the pod;
   closing the pod door of the pod containing the at least one processed substrate;
   latching the closed pod door;
   undocking the pod with the latched pod door from the pod loading station;
   redocking the undocked pod to the pod loading station;
   sensing a condition of at least one of the pod, the pod door and the pod loading station; and
   again undocking the pod from the pod loading station,
   wherein the pod door of the redocked pod is not unlatched prior to again undocking the pod from the pod loading station after the sensing step.

10. The method of claim 9 wherein opening the pod door comprises removing the pod door from the pod.

11. The method of claim 9 wherein sensing a condition of at least one of the pod, the pod door and the pod loading station comprises sensing a position of the pod door.

12. The method of claim 11 further comprising signaling a fault if the position of the pod door is not in a desired position.

13. An apparatus comprising:
   a pod loading station including:
   a docking mechanism adapted to move a pod between a docked position and an undocked position;
   a door opener adapted to open a pod door of the pod; and
   at least one sensor adapted to sense a condition of at least one of the pod door, and the docking mechanism, prior to opening the pod door, and
   a controller coupled to the pod loading station and programmed to:
   cause the docking mechanism to move the pod from the undocked position to the docked position;
   receive a signal from the at least one sensor;
   in response to the signal, determine whether the pod door is properly positioned, and if so, cause the door opener to open the door of the pod;
   close the pod door after at least one substrate contained in pod has been processed;
   cause the docking mechanism to move the pod with the closed pod door from the docked position to the undocked position;
   cause the docking mechanism to move the pod with the closed pod door from the undocked position to the docked position;
   receive a signal from the at least one sensor; and
   in response to the signal, determine whether the pod door is properly positioned;
   wherein the pod is not removed from the pod loading station between undocking and redocking the pod.

14. The apparatus of claim 13 wherein the sensor comprises a mechanism adapted to apply vacuum suction to a properly positioned pod door.

15. The apparatus of claim 13 wherein the sensor comprises a spring loaded mechanism adapted to contact the door of a properly positioned pod.

* * * * *